United States Patent
Li

(10) Patent No.: US 12,526,914 B2
(45) Date of Patent: Jan. 13, 2026

(54) ELECTRICAL MAGNETIC INTERFERENCE FILTER BOARD FOR POWER BUSBAR

(71) Applicant: GM Cruise Holdings LLC, San Francisco, CA (US)

(72) Inventor: Xiao Li, Milpitas, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 228 days.

(21) Appl. No.: 18/402,435

(22) Filed: Jan. 2, 2024

(65) Prior Publication Data

US 2025/0220805 A1    Jul. 3, 2025

(51) Int. Cl.
*H05K 1/00*    (2006.01)
*H05K 1/02*    (2006.01)

(52) U.S. Cl.
CPC ......... *H05K 1/0233* (2013.01); *H05K 1/0218* (2013.01); *H05K 1/0231* (2013.01)

(58) Field of Classification Search
CPC ... H05K 1/0233; H05K 1/0218; H05K 1/0231
See application file for complete search history.

(56) References Cited

U.S. PATENT DOCUMENTS

| | | | | |
|---|---|---|---|---|
| 4,814,943 A | * | 3/1989 | Okuaki | H01L 23/293 257/E23.125 |
| 8,803,005 B2 | * | 8/2014 | Arceneaux | H05K 9/0018 174/382 |
| 2016/0044835 A1 | * | 2/2016 | Lee | H05K 1/0216 29/841 |

* cited by examiner

*Primary Examiner* — Pete T Lee
(74) *Attorney, Agent, or Firm* — CANTOR COLBURN LLP

(57) ABSTRACT

The present disclosure generally relates to systems and techniques for mitigating electromagnetic interference and, more specifically, to using a filter printed circuit board (PCB) within an autonomous vehicle to mitigate electromagnetic interference. In some aspects, the disclosed technology includes: an autonomous driving super computer (ADSC) comprising: an enclosure that is coupled to a primary printed circuit board (PCB) of the ADSC; one or more power terminals that are coupled to the primary PCB and extend through the enclosure; a PCB positioned between the enclosure and the primary PCB, wherein the filter PCB includes one or more apertures to permit the one or more power terminals to extend through the filter PCB, and wherein the filter PCB is configured to mitigate electromagnetic interference emitted from the one or more power terminals.

20 Claims, 7 Drawing Sheets

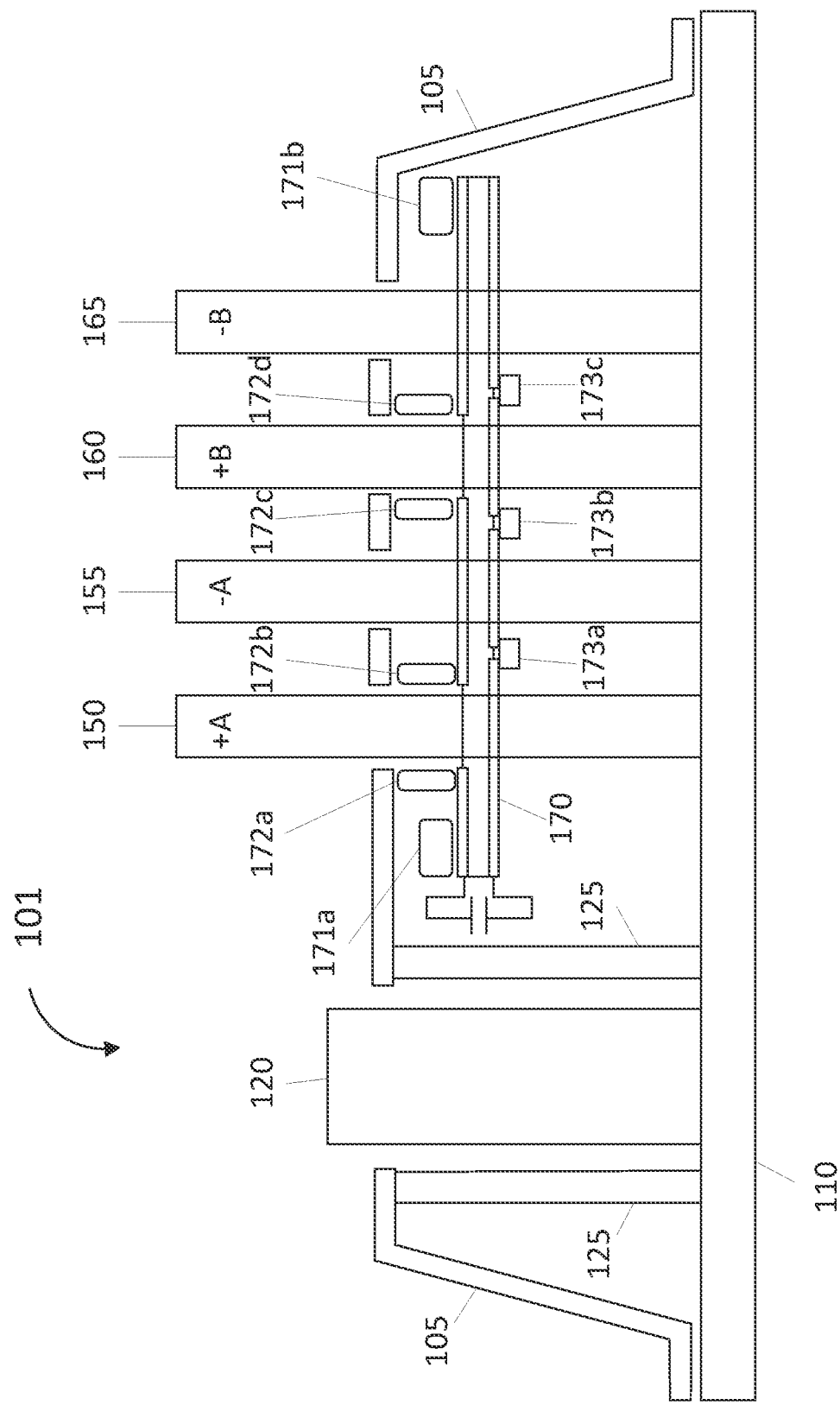

400

```
┌─────────────────────────────────────────────────────────────────┐
│ ATTACH ONE OR MORE POWER TERMINALS TO A PRIMARY PRINTED CIRCUIT │
│                           BOARD (PCB)                           │
│                              (402)                              │
└─────────────────────────────────────────────────────────────────┘
                                 │
                                 ▽
┌─────────────────────────────────────────────────────────────────┐
│  DISPOSE A FILTER PCB ON THE PRIMARY PCB, WHEREIN THE FILTER PCB │
│ INCLUDES ONE OR MORE APERTURES TO PERMIT THE ONE OR MORE POWER  │
│ TERMINALS TO EXTEND THROUGH THE FILTER PCB, WHEREIN THE FILTER PCB │
│  MITIGATES ELECTROMAGNETIC INTERFERENCE EMITTED FROM THE ONE OR │
│                        MORE POWER TERMINAL                      │
│                              (404)                              │
└─────────────────────────────────────────────────────────────────┘
                                 │
                                 ▽
┌─────────────────────────────────────────────────────────────────┐
│ ATTACH AN ENCLOSURE TO THE PRIMARY PCB, WHEREIN THE ONE OR MORE │
│           POWER TERMINALS EXTEND THROUGH THE ENCLOSURE          │
│                              (406)                              │
└─────────────────────────────────────────────────────────────────┘
```

FIG. 4

ELECTRICAL MAGNETIC INTERFERENCE FILTER BOARD FOR POWER BUSBAR

BACKGROUND

1. Technical Field

The present disclosure generally relates to systems and techniques for mitigating electromagnetic interference and, more specifically, to using a filter printed circuit board (PCB) within an autonomous vehicle to mitigate electromagnetic interference.

2. Introduction

An autonomous vehicle is a motorized vehicle that can navigate without a human driver. An exemplary autonomous vehicle can include various sensors, such as a camera sensor, a light detection and ranging (LIDAR) sensor, and a radio detection and ranging (RADAR) sensor, amongst others. The sensors collect data and measurements that the autonomous vehicle can use for operations such as navigation. The sensors can provide the data and measurements to an autonomous driving super computer (ADSC) of the autonomous vehicle, which can use the data and measurements to control a mechanical system of the autonomous vehicle, such as a vehicle propulsion system, a braking system, or a steering system. Typically, the ADSC is a high performance computing system with a wide array of electronic and compute components and systems that work together to perform a number of complex operations for the autonomous vehicle and control various systems on the autonomous vehicle.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which:

FIG. 1B illustrates a diagram of a cross section of an example PCB that includes an electromagnetic interference filtering PCB for use by an autonomous driving super computer (ADSC), according to some examples of the present disclosure;

FIG. 4 illustrates a process for manufacturing an autonomous driving super computer (ADSC), according to some examples of the present disclosure;

DETAILED DESCRIPTION

Figure 1A:
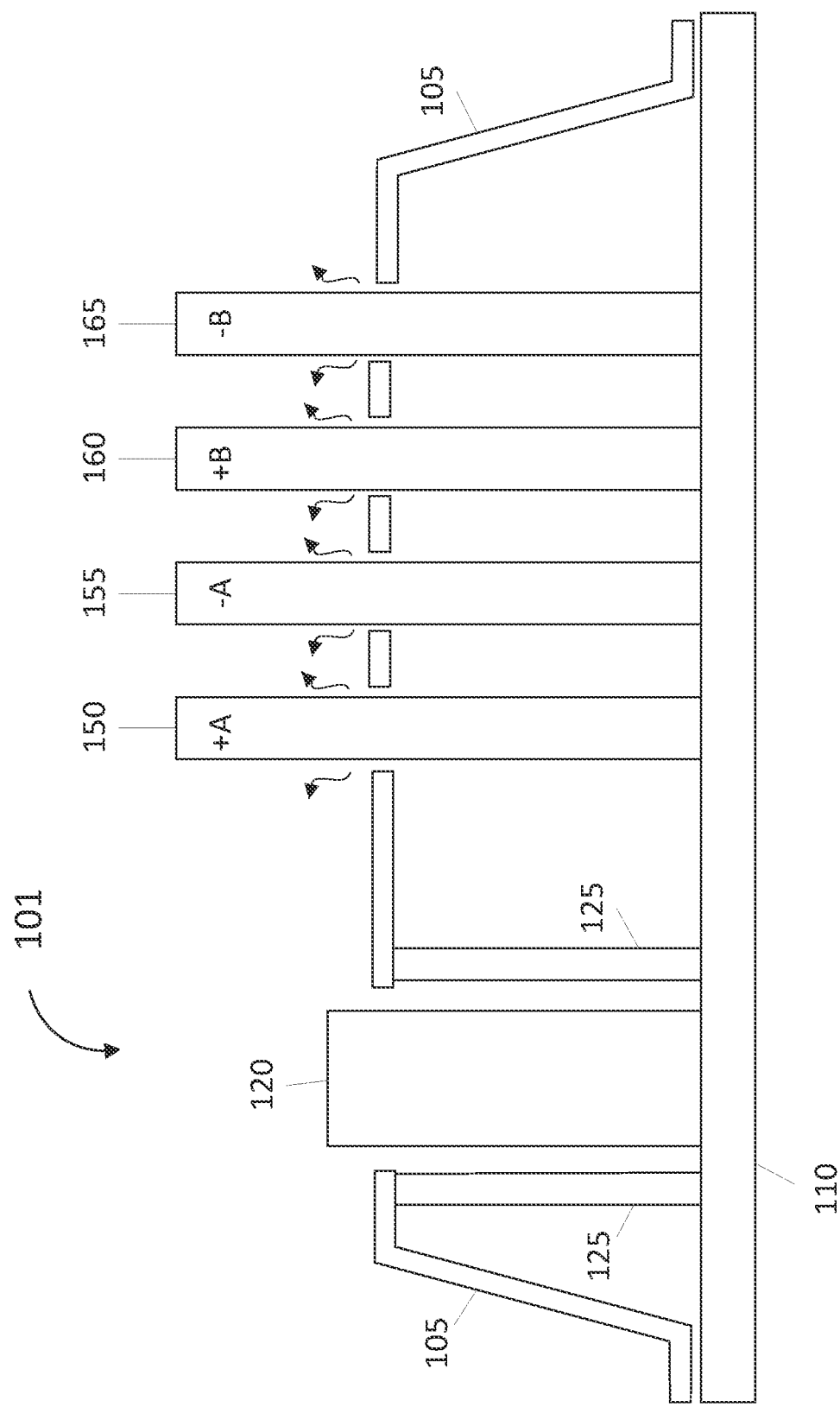
FIG. 1A illustrates a diagram of a cross section of an example printed circuit board (PCB) that may be used by an autonomous driving super computer (ADSC), according to some examples of the present disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form to avoid obscuring the concepts of the subject technology.

Some aspects of the present technology may relate to the gathering and use of data available from various sources to improve safety, quality, and experience. The present disclosure contemplates that in some instances, this gathered data may include personal information. The present disclosure contemplates that the entities involved with such personal information respect and value privacy policies and practices.

An autonomous vehicle (AV) can include one or more autonomous driving super computers (ADSCs) that can use data and measurements received from one or more sensors to control a mechanical system of the AV. In some cases, the ADSC can comprise an integrated compute and network system with many high-speed interfaces and components that operate under high power consumption. However, in some scenarios the various components of an ADSC can generate unwanted electromagnetic interference (EMI) that can negatively affect the operation of other components that are outside of the ADSC as well as components that are integrated within the ADSC (e.g., EMI can affect operation of the AV). In some cases, unwanted EMI can cause increased electrical noise that can cause one or more electronic components to error or fail.

In general, there are three external components of the ADSC that can contribute the most unwanted EMI. For example, the ADSC harness, the cables, and the power terminal can each radiate unwanted EMI within the ADSC. Electromagnetic compatibility (EMC) design can mitigate the generation or transmission of electromagnetic signals in ways that can make an ADSC less susceptible to EMI. For example, EMI emitted from an ADSC harness can be mitigated by placing a shielding cable (or shielding can) around the ADSC harness. The shielding cable (or shielding can) can comprise metal and function to keep the unwanted EMI within the shielding cable (or shielding can), and therefore away from the other components integrated within in the ADSC. Likewise, the various cables integrated within the ADSC can also be shielded using a metal shielding around or about the cables.

However, in some cases the power terminals of the ADSC cannot be shielded with shielding cables (or shielding cans), thereby leaving the power terminals susceptible to producing unwanted EMI that can interfere and/or negatively affect the operation of other components of the ADSC and/or other components within the AV and/or in proximity of the AV. The power terminals of the ADSC can be physical structures positioned to traverse the body of the ADSC while running high current DC power. Due to the length of the power cables (in some cases 8-10 meters, for example), shielding cables can add too much additional weight to be used. Additionally, due to design requirements and/or limited space within the ADSC, it can be difficult (or impossible) to integrate other shielding components around the power terminals. Described herein are systems, apparatuses, processes (also referred to as methods), and computer-readable media (collectively referred to as "systems and techniques") for mitigating unwanted EMI emitted from power terminals of an ADSC by positioning a filter printed circuit board (PCB) within the ADSC.

FIG. 1A illustrates a diagram of a cross section of an example ADSC 101. As illustrated in FIG. 1A, ADSC 101 can include a primary printed circuit board (PCB) 110 as well as a metal enclosure 105 that can be placed onto primary PCB 110, thereby enclosing various components of ADSC 101. Although not illustrated in FIG. 1A, ADSC 101 can also include various components connected to primary PCB 110 that operate together to aid in the operation of ADSC 101. The enclosure 105 can also include holes to permit some components to be accessible outside of the enclosure 105. For example, harness 120 can be connected to primary PCB 110 on one end while the other end of the harness 120 extends through a hole in enclosure 105 to permit external connections. Harness 120 can be encircled by a metallic shielding cable (or shielding can) 125 that can surround the harness 120, thereby preventing unwanted EMI from leaking from both the harness 120 and ADSC 101, thereby negatively affecting the various other components within ADSC 101 (most of which are not illustrated in FIG. 1A).

Power terminals 150, 155, 160, and 165 (also referred to as "busbars") can also be connected to primary PCB 110 on one end while the other end extends through a hole in enclosure 105 to permit external connections. The ADSC 101 can be powered by connecting a power source (such as, for example, an AV battery or some other power supply) to the power terminals 150, 155, 160, and 165 using one or more cables. In some aspects, the power terminals 150, 155, 160, and 165 can provide two DC inputs (e.g., "+A" at power terminal 150, "−A" at power terminal 155, "+B" at power terminal 160, and "−B" at power terminal 165) to the ADSC 101. In some examples, "+A" at power terminal 150 can be connected to +12V; "−A" at power terminal 155 can be connected to ground; "+B" at power terminal 160 can be connected to +12V; and "−B" at power terminal 165 can be connected to ground. In some examples, design requirements can result in gaps between the enclosure 105 and the power terminals 150, 155, 160, and 165. These gaps can cause internal radiated EMI noise to leak and also cause conductive noise to couple the power terminals. However, as discussed above, in many scenarios, power terminals 150, 155, 160, and 165 cannot be shielded using shielding cables. Therefore, the AC noise coupled through the power terminals 150, 155, 160, and 165 can emit unwanted EMI (as indicated by the arrows in FIG. 1A) that can cause increased electrical noise thereby causing one or more electronic components integrated within the ADSC 101 to error or fail. Additionally, the electrical noise caused by the unwanted EMI can also couple to the noise emitted by the ADSC 101 itself and cause error or failure in other devices located within the AV. Because it can be difficult to implement traditional shielding cables, shielding cans, and/or absorber clamps about or around power terminals 150, 155, 160, and 165 to mitigate unwanted EMI, a novel approach of providing a filter PCB within ADSC 101 is explained with reference to FIG. 1B below.

FIG. 1B illustrates a diagram of a cross section of an example ADSC 101 that includes a filter PCB 170 (as well as other optional EMI mitigating components as discussed below). In some examples, filter PCB 170 can comprise four or six layers (although there is no limit to the number of layers that can be used), as explained in more detail below with reference to FIG. 2. Filter PCB 170 can be placed within ADSC 101 at a position above primary PCB 110 (as illustrated in FIG. 1B). The planar capacitance of the layers of filter PCB 170 can reduce conducive noise on the power terminals 150, 155, 160, and 165. Due to the limited space within ADSC 101, a thinner filter PCB 170 can be desired. For example, in some scenarios a filter PCB 170 can be optimally designed to be approximately 39 mil. While there is no limit to the number of layers that can comprise filter PCB 170 (and more layers can provide better performance), additional layers can require additional space and can increase costs. Additionally, the filter PCB 170 can be optimized by simulation to determine the optimal trade off between cost and performance.

Optionally, conductive gaskets 172a, 172b, 172c, and 172d can be placed between the filter PCB 170 and enclosure 105 to further reduce radiated noise. Additionally, resistor-capacitor (RC) components 173a, 173b, and 173c can be optionally placed on the filter PCB 170 as illustrated in FIG. 1B for additional filtering to further reduce conductive noise. In some examples, RC components 173a, 173b, and 173c can be optimized by simulation or test results. EMI absorbers 171a and 171b can also be optionally placed on the filter PCB 170 to further mitigate radiate noise. In some examples, EMI absorbers 171a and 171b can be optimized by simulation or test results.

In some configurations, filter PCB 170 can include cutouts (or holes) to permit power terminals 150, 155, 160, and 165 to pass through. In operation, filter PCB 170 can take advantage of the positive power and the ground being located in different layers to make power to GND overlap, thereby introducing planar capacitance between positive power and ground (for example, in the case of a four layer filter PCB 170, the first and third layers correspond to A+ and B+, while the second and fourth layers correspond to ground). This can help reduce unwanted conductive noise. The filter PCB 170 can be installed directly on power terminals 150, 155, 160, and 165, above the primary PCB 110, and inside the enclosure. In some examples, a non-conductive supporter (not shown) can be used to hold filter PCB 170 to the power terminals 150, 155, 160, and 165, above the primary PCB 110. The conductive gaskets 172a, 172b, 172c, and 172d can be used to connect the ground layer of filter PCB 170 to enclosure 105 (as shown in FIG. 1B), in order to reduce radiated noise leaking from the gaps between enclosure 105 and power terminals 150, 155, 160, and 165. Therefore, by placing filter PCB 170 within ADSC 101 in the manner described, unwanted external EMI coupled to power terminals 150, 155, 160, and 165 can be re-directed to and/or absorbed by filter PCB 170 rather than towards other components within ADSC 101. Additionally, unwanted EMI emitted from power terminals 150, 155, 160, and 165 can be re-directed to and/or absorbed by filter PCB 170 rather than towards other devices that may be located within the AV.

Figure 2:
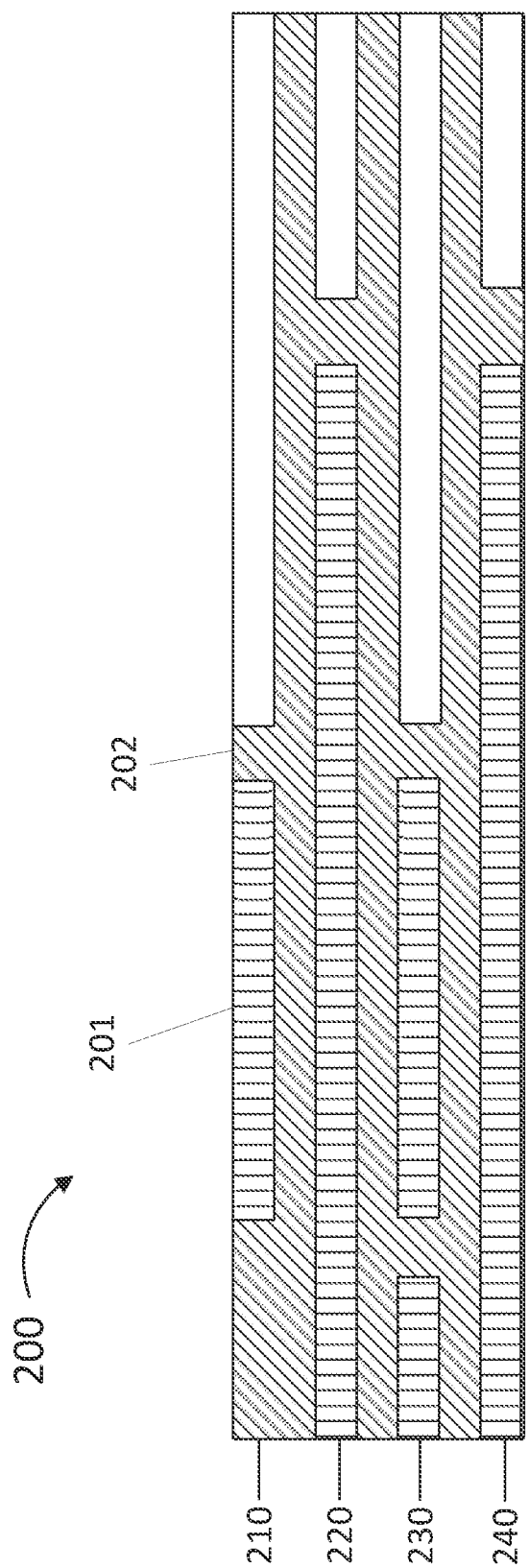
FIG. 2 illustrates a diagram of an example filter printed circuit board (PCB) comprising four layers, according to some examples of the present disclosure.

FIG. 2 illustrates a diagram of an example filter PCB 200 (such as, for example, filter PCB 170) comprising four layers that can mitigate EMI within ADSC 101. As discussed above, filter PCB 200 can comprise more than four layers, depending on space and cost (among other) considerations, and is not limited to the four layers shown in FIG. 2. The filer PCB 200 illustrated in FIG. 2 comprises layers 210, 220, 230, and 240; each of layers 210, 220, 230, and 240 comprise a positive voltage portion 201 and a ground portion 202. As illustrated in FIG. 2, portions of the positive voltage portion 201 within a layer overlap with portions of the ground portion 202 in other layers. This overlap can function to increase the planar capacitance of filter PCB 200, thereby mitigating EMI emitted from power terminals 150, 155, 160, and 165.

Figure 3:
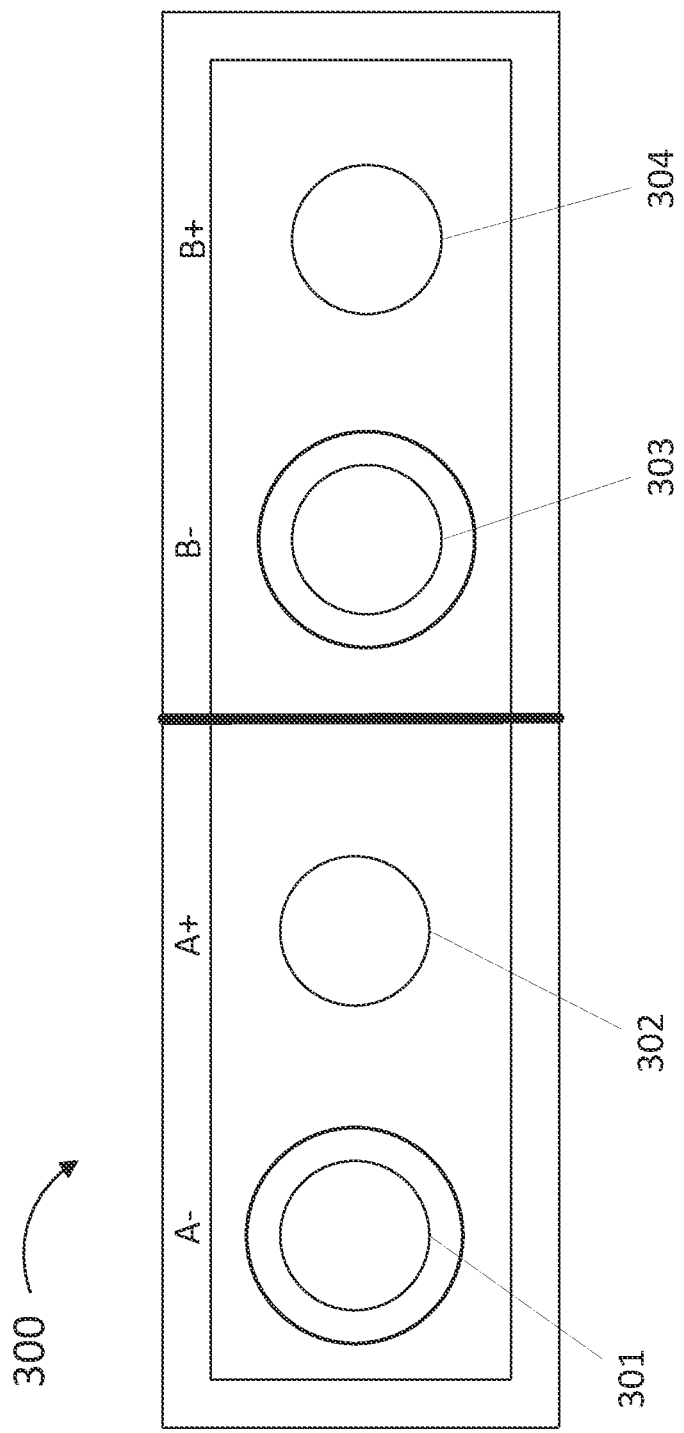
FIG. 3 illustrates a perspective view of an example filter printed circuit board (PCB), according to some examples of the present disclosure.

FIG. 3 illustrates a perspective view of an example filter PCB 300 (such as, for example, filter PCB 170 and filter PCB 200 discussed above). Example filter PCB 300 comprises four holes (e.g., holes 301, 302, 303, and 204) that can permit power terminals 150, 155, 160, and 165 (illustrated in FIGS. 1A and 1B) to pass through. For example, power terminal 155 (i.e., A−) can pass through hole 301, power terminal 150 (i.e., A+) can pass through hole 302, power terminal 165 (i.e., B−) can pass through hole 303, and power terminal 160 (i.e., B+) can pass through hole 304. As discussed above, filter PCB 300 can comprise four or more layers that can overlap to increase the planar capacitance of filter PCB 300, thereby mitigating EMI emitted from power terminals 150, 155, 160, and 165.

FIG. 4 illustrates a process 400 for manufacturing an ADSC (e.g., ADSC 101). At block 402, the process 400 can include attaching one or more power terminals (e.g., power terminals 150, 155, 160, and 165) to a primary PCB (e.g., primary PCB 110). For example, power terminals 150, 155, 160, and 165 (also referred to as "busbars") can also be connected to primary PCB 110 on one end while the other end extends through a hole in enclosure 105 to permit external connections. The ADSC 101 can be powered by connecting a power source (such as, for example, an AV battery or some other power supply) to the power terminals 150, 155, 160, and 165 using one or more cables. In some aspects, the power terminals 150, 155, 160, and 165 can provide two DC inputs (e.g., "+A" at power terminal 150, "−A" at power terminal 155, "+B" at power terminal 160, and "−B" at power terminal 165) to the ADSC 101. In some examples, "+A" at power terminal 150 can be connected to +12V; "−A" at power terminal 155 can be connected to ground; "+B" at power terminal 160 can be connected to +12V; and "−B" at power terminal 165 can be connected to ground.

At block 404, the process 400 can include disposing a filter PCB (e.g., filter PCB 170) on the primary PCB (e.g., primary PCB 110), wherein the filter PCB (e.g., filter PCB 170) includes one or more apertures to permit the one or more power terminals to extend through the filter PCB, and wherein the filter PCB mitigates electromagnetic interference emitted from the one or more power terminal. As shown in FIG. 1B, example ADSC 101 can include filter PCB 170 (as well as other optional EMI mitigating components as discussed below). For example, filter PCB 170 can comprise four or six layers (although there is no limit to the number of layers that can be used). As illustrated in FIG. 2, portions of the positive voltage portion 201 within a layer overlap with portions of the ground portion 202 in other layers. This overlap can function to increase the planar capacitance of filter PCB 200, thereby mitigating EMI emitted from power terminals 150, 155, 160, and 165. Filter PCB 170 can be placed within ADSC 101 at a position above primary PCB 110 (as illustrated in FIG. 1B). The planar capacitance of the layers of filter PCB 170 can reduce conductive noise on the power terminals 150, 155, 160, and 165. Due to the limited space within ADSC 101, a thinner filter PCB 170 can be desired. For example, in some scenarios a filter PCB 170 can be optimally designed to be approximately 39 mil. While there is no limit to the number of layers that can comprise filter PCB 170 (and more layers can provide better performance), additional layers can require additional space and can increase costs. Additionally, the filter PCB 170 can be optimized by simulation to determine the optimal trade off between cost and performance At block 406, the process 400 can include attaching an enclosure (e.g., enclosure 105) to a primary PCB (e.g., primary PCB 110), wherein the one or more power terminals extend through the enclosure. As illustrated in FIG. 1A above, ADSC 101 can include a primary printed circuit board (PCB) 110 as well as a metal enclosure 105 that can be placed onto primary PCB 110, thereby enclosing various components of ADSC 101. The enclosure 105 can include holes to permit components to be accessible outside of the enclosure 105. Power terminals 150, 155, 160, and 165 (also referred to as "busbars") can also be connected to primary PCB 110 on one end while the other end extends through a hole in enclosure 105 to permit external connections. Although not illustrated in FIG. 1A, ADSC 101 can also include various components connected to primary PCB 110 that operate together to aid in the operation of ADSC 101.

Figure 5:
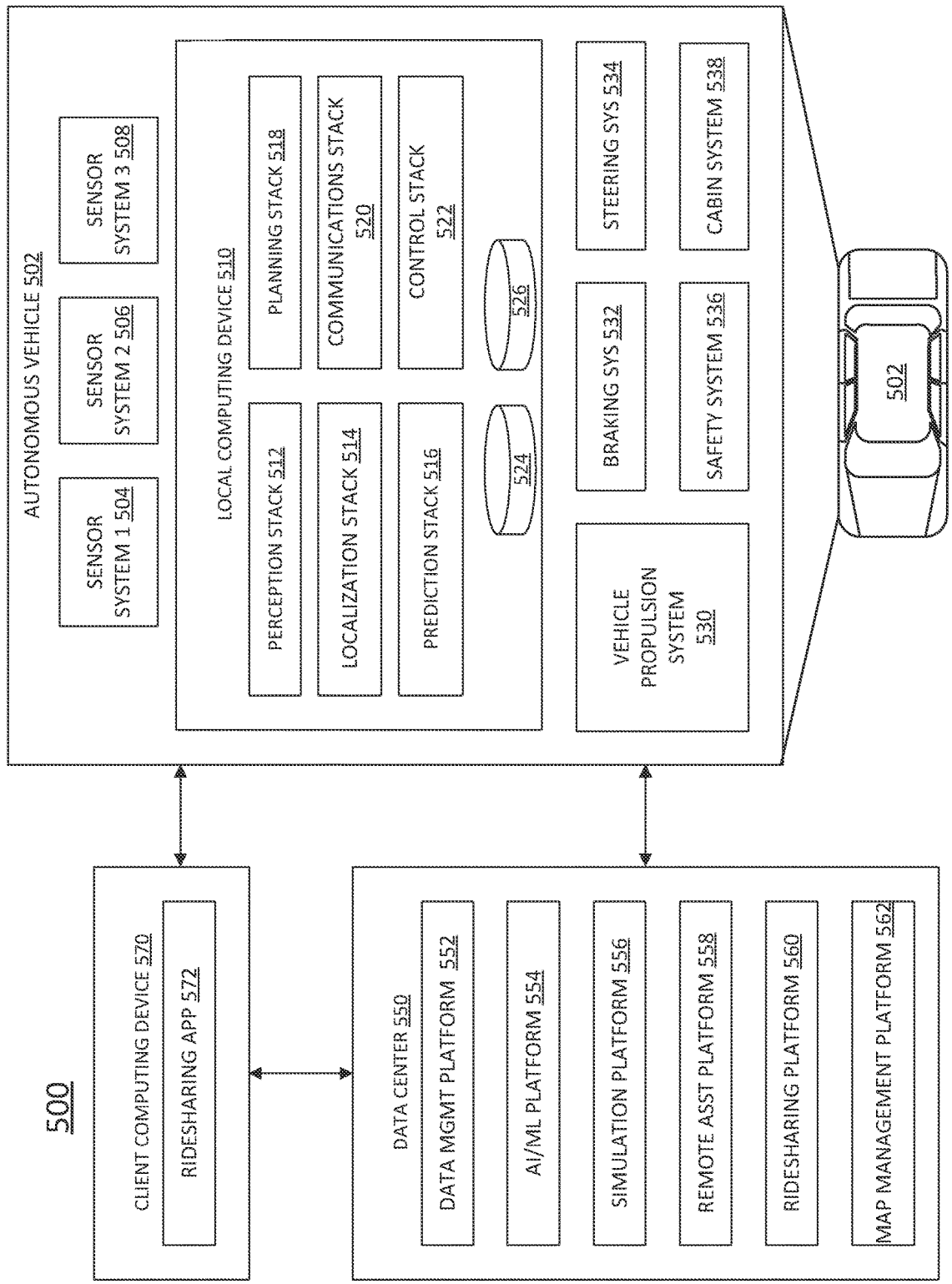
FIG. 5 illustrates an example system environment that can be used to facilitate autonomous vehicle (AV) dispatch and operations, according to some aspects of the disclosed technology.

FIG. 5 is a diagram illustrating an example autonomous vehicle (AV) environment 500, according to some examples of the present disclosure. One of ordinary skill in the art will understand that, for AV environment 500 and any system discussed in the present disclosure, there can be additional or fewer components in similar or alternative configurations. The illustrations and examples provided in the present disclosure are for conciseness and clarity. Other examples may include different numbers and/or types of elements, but one of ordinary skill the art will appreciate that such variations do not depart from the scope of the present disclosure.

In this example, the AV environment 500 includes an AV 502, a data center 550, and a client computing device 570. The AV 502, the data center 550, and the client computing device 570 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 502 can navigate roadways without a human driver based on sensor signals generated by multiple sensor systems 504, 506, and 508. The sensor systems 504-508 can include one or more types of sensors and can be arranged about the AV 502. For instance, the sensor systems 504-508 can include Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 504 can be a camera system, the sensor system 506 can be a LIDAR system, and the sensor system 508 can be a RADAR system. Other examples may include any other number and type of sensors.

The AV 502 can also include several mechanical systems that can be used to maneuver or operate the AV 502. For instance, the mechanical systems can include a vehicle propulsion system 530, a braking system 532, a steering system 534, a safety system 536, and a cabin system 538, among other systems. The vehicle propulsion system 530 can include an electric motor, an internal combustion engine, or both. The braking system 532 can include an engine brake, brake pads, actuators, and/or any other suitable componentry configured to assist in decelerating the AV 502. The steering system 534 can include suitable componentry configured to control the direction of movement of the AV 502 during navigation. The safety system 536 can include lights and signal indicators, a parking brake, airbags, and so forth. The cabin system 538 can include cabin temperature control systems, in-cabin entertainment systems, and so forth. In some examples, the AV 502 might not include human driver actuators (e.g., steering wheel, handbrake, foot brake pedal, foot accelerator pedal, turn signal lever, window wipers, etc.) for controlling the AV 502. Instead, the cabin system 538 can include one or more client interfaces (e.g., Graphical User Interfaces (GUIs), Voice User Interfaces (VUIs), etc.) for controlling certain aspects of the mechanical systems 530-538.

The AV 502 can include a local computing device 510 that is in communication with the sensor systems 504-508, the mechanical systems 530-538, the data center 550, and the client computing device 570, among other systems. The local computing device 510 can include one or more processors and memory, including instructions that can be executed by the one or more processors. The instructions can make up one or more software stacks or components responsible for controlling the AV 502; communicating with the data center 550, the client computing device 570, and other systems; receiving inputs from riders, passengers, and other entities within the AV's environment; logging metrics collected by the sensor systems 504-508; and so forth. In this example, the local computing device 510 includes a perception stack 512, a localization stack 514, a prediction stack 516, a planning stack 518, a communications stack 520, a control stack 522, an AV operational database 524, and an HD geospatial database 526, among other stacks and systems.

Perception stack 512 can enable the AV 502 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 504-508, the localization stack 514, the HD geospatial database 526, other components of the AV, and other data sources (e.g., the data center 550, the client computing device 570, third party data sources, etc.). The perception stack 512 can detect and classify objects and determine their current locations, speeds, directions, and the like. In addition, the perception stack 512 can determine the free space around the AV 502 (e.g., to maintain a safe distance from other objects, change lanes, park the AV, etc.). The perception stack 512 can identify environmental uncertainties, such as where to look for moving objects, flag areas that may be obscured or blocked from view, and so forth. In some examples, an output of the perception stack 512 can be a bounding area around a perceived object that can be associated with a semantic label that identifies the type of object that is within the bounding area, the kinematic of the object (information about its movement), a tracked path of the object, and a description of the pose of the object (its orientation or heading, etc.).

Localization stack 514 can determine the AV's position and orientation (pose) using different methods from multiple systems (e.g., GPS, IMUs, cameras, LIDAR, RADAR, ultrasonic sensors, the HD geospatial database 526, etc.). For example, in some cases, the AV 502 can compare sensor data captured in real-time by the sensor systems 504-508 to data in the HD geospatial database 526 to determine its precise (e.g., accurate to the order of a few centimeters or less) position and orientation. The AV 502 can focus its search based on sensor data from one or more first sensor systems (e.g., GPS) by matching sensor data from one or more second sensor systems (e.g., LIDAR). If the mapping and localization information from one system is unavailable, the AV 502 can use mapping and localization information from a redundant system and/or from remote data sources.

Prediction stack 516 can receive information from the localization stack 514 and objects identified by the perception stack 512 and predict a future path for the objects. In some examples, the prediction stack 516 can output several likely paths that an object is predicted to take along with a probability associated with each path. For each predicted path, the prediction stack 516 can also output a range of points along the path corresponding to a predicted location of the object along the path at future time intervals along with an expected error value for each of the points that indicates a probabilistic deviation from that point.

Planning stack 518 can determine how to maneuver or operate the AV 502 safely and efficiently in its environment. For example, the planning stack 518 can receive the location, speed, and direction of the AV 502, geospatial data, data regarding objects sharing the road with the AV 502 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 502 from one point to another and outputs from the perception stack 512, localization stack 514, and prediction stack 516. The planning stack 518 can determine multiple sets of one or more mechanical operations that the AV 502 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 518 can select from multiple backup plans to carry out. For example, while preparing to change lanes to turn right at an intersection, another vehicle may aggressively cut into the destination lane, making the lane change unsafe. The planning stack 518 could have already determined an alternative plan for such an event. Upon its occurrence, it could help direct the AV 502 to go around the block instead of blocking a current lane while waiting for an opening to change lanes.

Control stack 522 can manage the operation of the vehicle propulsion system 530, the braking system 532, the steering system 534, the safety system 536, and the cabin system 538. The control stack 522 can receive sensor signals from the sensor systems 504-508 as well as communicate with other stacks or components of the local computing device 510 or a remote system (e.g., the data center 550) to effectuate operation of the AV 502. For example, the control stack 522 can implement the final path or actions from the multiple paths or actions provided by the planning stack 518. This can involve turning the routes and decisions from the planning stack 518 into commands for the actuators that control the AV's steering, throttle, brake, and drive unit.

Communications stack 520 can transmit and receive signals between the various stacks and other components of the AV 502 and between the AV 502, the data center 550, the client computing device 570, and other remote systems. The communications stack 520 can enable the local computing device 510 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). Communications stack 520 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Low Power Wide Area Network (LPWAN), Bluetooth®, infrared, etc.).

The HD geospatial database 526 can store HD maps and related data of the streets upon which the AV 502 travels. In some examples, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include three-dimensional (3D) attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

AV operational database 524 can store raw AV data generated by the sensor systems 504-508, stacks 512-522, and other components of the AV 502 and/or data received by the AV 502 from remote systems (e.g., the data center 550, the client computing device 570, etc.). In some examples, the raw AV data can include HD LIDAR point cloud data, image data, RADAR data, GPS data, and other sensor data that the data center 550 can use for creating or updating AV geospatial data or for creating simulations of situations encountered by AV 502 for future testing or training of various machine learning algorithms that are incorporated in the local computing device 510.

Data center 550 can include a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and/or any other network. The data center 550 can include one or more computing devices remote to the local computing device 510 for managing a fleet of AVs and AV-related services. For example, in addition to managing the AV 502, the data center 550 may also support a ride-hailing service (e.g., a ridesharing service), a delivery service, a remote/roadside assistance service, street services (e.g., street mapping, street patrol, street cleaning, street metering, parking reservation, etc.), and the like.

Data center 550 can send and receive various signals to and from the AV 502 and the client computing device 570. These signals can include sensor data captured by the sensor systems 504-508, roadside assistance requests, software updates, ride-hailing/ridesharing pick-up and drop-off instructions, and so forth. In this example, the data center 550 includes a data management platform 552, an Artificial Intelligence/Machine Learning (AI/ML) platform 554, a simulation platform 556, a remote assistance platform 558, and a ride-hailing platform 560, and a map management platform 562, among other systems.

Data management platform 552 can be a "big data" system capable of receiving and transmitting data at high velocities (e.g., near real-time or real-time), processing a large variety of data and storing large volumes of data (e.g., terabytes, petabytes, or more of data). The varieties of data can include data having different structures (e.g., structured, semi-structured, unstructured, etc.), data of different types (e.g., sensor data, mechanical system data, ride-hailing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), and/or data having other characteristics. The various platforms and systems of the data center 550 can access data stored by the data management platform 552 to provide their respective services.

The AI/ML platform 554 can provide the infrastructure for training and evaluating machine learning algorithms for operating the AV 502, the simulation platform 556, the remote assistance platform 558, the ride-hailing platform 560, the map management platform 562, and other platforms and systems. Using the AI/ML platform 554, data scientists can prepare data sets from the data management platform 552; select, design, and train machine learning models; evaluate, refine, and deploy the models; maintain, monitor, and retrain the models; and so on.

Simulation platform 556 can enable testing and validation of the algorithms, machine learning models, neural networks, and other development efforts for the AV 502, the remote assistance platform 558, the ride-hailing platform 560, the map management platform 562, and other platforms and systems. Simulation platform 556 can replicate a variety of driving environments and/or reproduce real-world scenarios from data captured by the AV 502, including rendering geospatial information and road infrastructure (e.g., streets, lanes, crosswalks, traffic lights, stop signs, etc.) obtained from a cartography platform (e.g., map management platform 562); modeling the behavior of other vehicles, bicycles, pedestrians, and other dynamic elements; simulating inclement weather conditions, different traffic scenarios; and so on.

Remote assistance platform 558 can generate and transmit instructions regarding the operation of the AV 502. For example, in response to an output of the AI/ML platform 554 or other system of the data center 550, the remote assistance platform 558 can prepare instructions for one or more stacks or other components of the AV 502.

Ride-hailing platform 560 can interact with a customer of a ride-hailing service via a ride-hailing application 572 executing on the client computing device 570. The client computing device 570 can be any type of computing system such as, for example and without limitation, a server, desktop computer, laptop computer, tablet computer, smartphone, smart wearable device (e.g., smartwatch, smart eyeglasses or other Head-Mounted Display (HMD), smart ear pods, or other smart in-ear, on-ear, or over-ear device, etc.), gaming system, or any other computing device for accessing the ride-hailing application 572. The client computing device 570 can be a customer's mobile computing device or a computing device integrated with the AV 502 (e.g., the local computing device 510). The ride-hailing platform 560 can receive requests to pick up or drop off from the ride-hailing application 572 and dispatch the AV 502 for the trip.

Map management platform 562 can provide a set of tools for the manipulation and management of geographic and spatial (geospatial) and related attribute data. The data management platform 552 can receive LIDAR point cloud data, image data (e.g., still image, video, etc.), RADAR data, GPS data, and other sensor data (e.g., raw data) from one or more AVs 502, Unmanned Aerial Vehicles (UAVs), satellites, third-party mapping services, and other sources of geospatially referenced data. The raw data can be processed, and map management platform 562 can render base representations (e.g., tiles (2D), bounding volumes (3D), etc.) of the AV geospatial data to enable users to view, query, label, edit, and otherwise interact with the data. Map management platform 562 can manage workflows and tasks for operating on the AV geospatial data. Map management platform 562 can control access to the AV geospatial data, including granting or limiting access to the AV geospatial data based on user-based, role-based, group-based, task-based, and other attribute-based access control mechanisms. Map management platform 562 can provide version control for the AV geospatial data, such as to track specific changes that (human or machine) map editors have made to the data and to revert changes when necessary. Map management platform 562 can administer release management of the AV geospatial data, including distributing suitable iterations of the data to different users, computing devices, AVs, and other consumers of HD maps. Map management platform 562 can provide analytics regarding the AV geospatial data and related data, such as to generate insights relating to the throughput and quality of mapping tasks.

In some embodiments, the map viewing services of map management platform 562 can be modularized and deployed as part of one or more of the platforms and systems of the data center 550. For example, the AI/ML platform 554 may incorporate the map viewing services for visualizing the effectiveness of various object detection or object classification models, the simulation platform 556 may incorporate the map viewing services for recreating and visualizing certain driving scenarios, the remote assistance platform 558 may incorporate the map viewing services for replaying traffic incidents to facilitate and coordinate aid, the ride-hailing platform 560 may incorporate the map viewing services into the client application 572 to enable passengers to view the AV 502 in transit en route to a pick-up or drop-off location, and so on.

While the autonomous vehicle 502, the local computing device 510, and the autonomous vehicle environment 500 are shown to include certain systems and components, one of ordinary skill will appreciate that the autonomous vehicle 502, the local computing device 510, and/or the autonomous vehicle environment 500 can include more or fewer systems and/or components than those shown in FIG. 5. For example, the autonomous vehicle 502 can include other services than those shown in FIG. 5 and the local computing device 510 can also include, in some instances, one or more memory devices (e.g., RAM, ROM, cache, and/or the like), one or more network interfaces (e.g., wired and/or wireless communications interfaces and the like), and/or other hardware or processing devices that are not shown in FIG. 5. An illustrative example of a computing device and hardware components that can be implemented with the local computing device 510 is described below with respect to FIG. 6.

Figure 6:
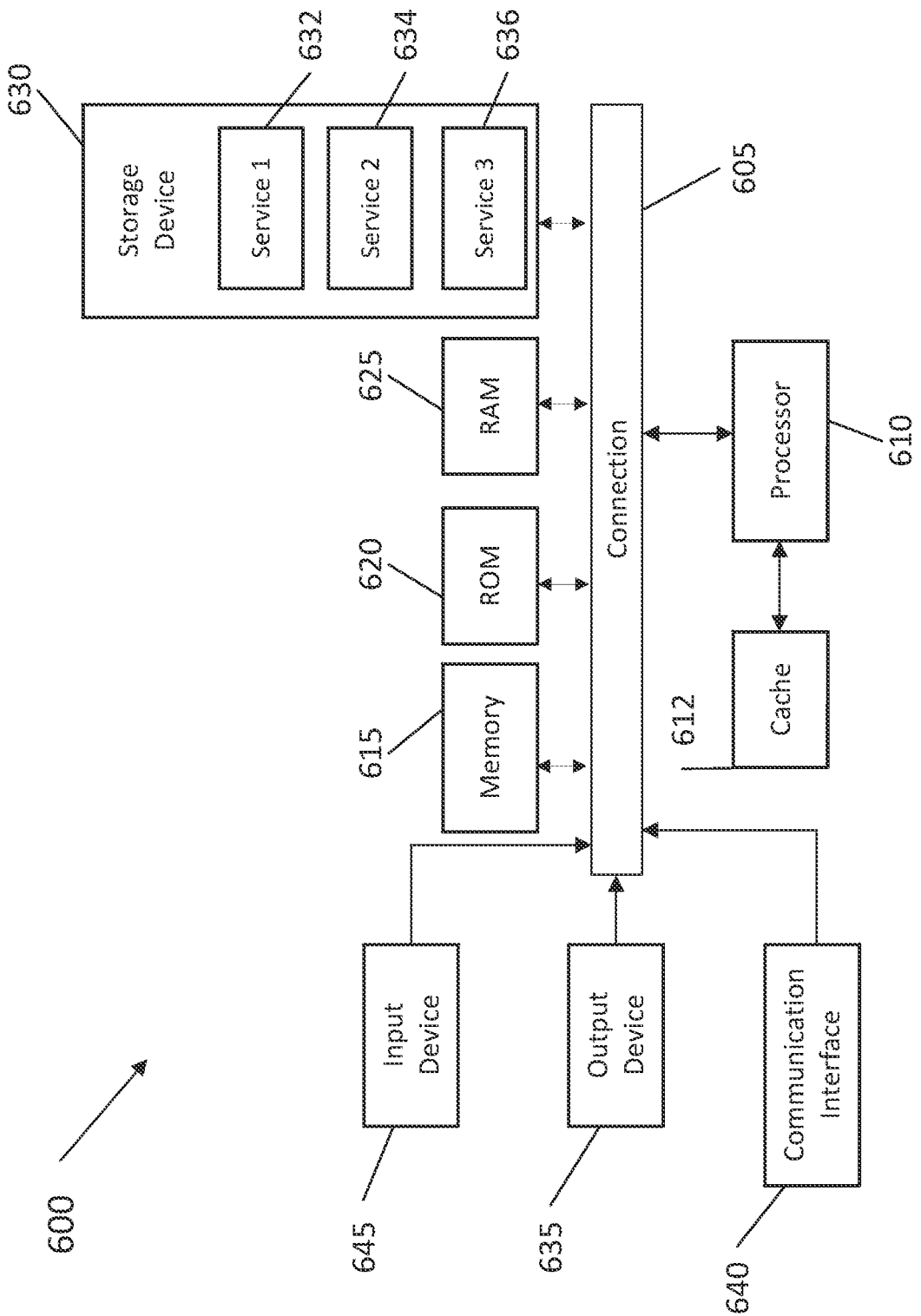
FIG. 6 illustrates an example processor-based system with which some aspects of the subject technology can be implemented.

FIG. 6 illustrates an example processor-based system with which some aspects of the subject technology can be implemented. For example, processor-based system 600 can be any computing device making up, or any component thereof in which the components of the system are in communication with each other using connection 605. Connection 605 can be a physical connection via a bus, or a direct connection into processor 610, such as in a chipset architecture. Connection 605 can also be a virtual connection, networked connection, or logical connection.

In some embodiments, computing system 600 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 600 includes at least one processing unit (Central Processing Unit (CPU) or processor) 610 and connection 605 that couples various system components including system memory 615, such as Read-Only Memory (ROM) 620 and Random-Access Memory (RAM) 625 to processor 610. Computing system 600 can include a cache of high-speed memory 612 connected directly with, in close proximity to, or integrated as part of processor 610.

Processor 610 can include any general-purpose processor and a hardware service or software service, such as services 632, 634, and 636 stored in storage device 630, configured to control processor 610 as well as a special-purpose processor where software instructions are incorporated into the actual processor design. Processor 610 may essentially be a completely self-contained computing system, containing multiple cores or processors, a bus, memory controller, cache, etc. A multi-core processor may be symmetric or asymmetric.

To enable user interaction, computing system 600 includes an input device 645, which can represent any number of input mechanisms, such as a microphone for speech, a touch-sensitive screen for gesture or graphical input, keyboard, mouse, motion input, speech, etc. Computing system 600 can also include output device 635, which can be one or more of a number of output mechanisms known to those of skill in the art. In some instances, multimodal systems can enable a user to provide multiple types of input/output to communicate with computing system 600. Computing system 600 can include communications interface 640, which can generally govern and manage the user input and system output. The communication interface may perform or facilitate receipt and/or transmission wired or wireless communications via wired and/or wireless transceivers, including those making use of an audio jack/plug, a microphone jack/plug, a Universal Serial Bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a Radio-Frequency Identification (RFID) wireless signal transfer, Near-Field Communications (NFC) wireless signal transfer, Dedicated Short Range Communication (DSRC) wireless signal transfer, 802.11 Wi-Fi® wireless signal transfer, Wireless Local Area Network (WLAN) signal transfer, Visible Light Communication (VLC) signal transfer, Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer signal transfer, ultraviolet light signal transfer, wireless signal transfer along the electromagnetic spectrum, or some combination thereof.

Communication interface 640 may also include one or more Global Navigation Satellite System (GNSS) receivers or transceivers that are used to determine a location of the computing system 600 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 630 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a Compact Disc (CD) Read Only Memory (CD-ROM) optical disc, a rewritable CD optical disc, a Digital Video Disk (DVD) optical disc, a Blu-ray Disc (BD) optical disc, a holographic optical disk, another optical medium, a Secure Digital (SD) card, a micro SD (microSD) card, a Memory Stick® card, a smartcard chip, a EMV chip, a Subscriber Identity Module (SIM) card, a mini/micro/nano/pico SIM card, another Integrated Circuit (IC) chip/card, Random-Access Memory (RAM), Atatic RAM (SRAM), Dynamic RAM (DRAM), Read-Only Memory (ROM), Programmable ROM (PROM), Erasable PROM (EPROM), Electrically Erasable PROM (EEPROM), flash EPROM (FLASHEPROM), cache memory (L1/L2/L3/L4/L5/L #), Resistive RAM (RRAM/ReRAM), Phase Change Memory (PCM), Spin Transfer Torque RAM (STT-RAM), another memory chip or cartridge, and/or a combination thereof.

Storage device 630 can include software services, servers, services, etc., that when the code that defines such software is executed by the processor 610, it causes the system 600 to perform a function. In some embodiments, a hardware service that performs a particular function can include the software component stored in a computer-readable medium in connection with the necessary hardware components, such as processor 610, connection 605, output device 635, etc., to carry out the function.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network Personal Computers (PCs), minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

Aspect 1. An autonomous driving super computer (ADSC) comprising: an enclosure that is coupled to a primary printed circuit board (PCB) of the ADSC; one or more power terminals that are coupled to the primary PCB and extend through the enclosure; a filter PCB positioned between the enclosure and the primary PCB, wherein the filter PCB includes one or more apertures to permit the one or more power terminals to extend through the filter PCB, and wherein the filter PCB is configured to mitigate electromagnetic interference emitted from the one or more power terminals.

Aspect 2. The ADSC of Aspect 1, wherein the filter PCB comprises four or more layers.

Aspect 3. The ADSC of Aspect 1 or 2, further comprising: one or more electromagnetic interference absorbers disposed on a surface of the filter PCB.

Aspect 4. The ADSC of any of Aspects 1 to 3, further comprising: one or more conductive gaskets disposed between the filter PCB and the enclosure.

Aspect 5. The ADSC of any of Aspects 1 to 4, further comprising: one or more resistor-capacitor (RC) circuits disposed on a surface of the filter PCB.

Aspect 6. The ADSC of any of Aspects 1 to 5, wherein the ADSC controls one of a mechanical system and an electrical system of an autonomous vehicle.

Aspect 7. The ADSC of any of Aspects 1 to 6, further comprising: a non-conductive supporter to connect the filter PCB to the one or more power terminals.

Aspect 8. A method of manufacturing an autonomous driving super computer (ADSC) comprising: attaching one or more power terminals to a primary printed circuit board (PCB); disposing a filter PCB on the primary PCB, wherein the filter PCB includes one or more apertures to permit the one or more power terminals to extend through the filter PCB, wherein the filter PCB mitigates electromagnetic interference emitted from the one or more power terminals; and attaching an enclosure to the primary PCB, wherein the one or more power terminals extend through the enclosure.

Aspect 9. The method of manufacturing the ADSC of Aspect 8, wherein the filter PCB comprises two or more layers.

Aspect 10. The method of manufacturing the ADSC of Aspect 8 or 9, further comprising: attaching one or more electromagnetic interference absorbers on a surface of the filter PCB.

Aspect 11. The method of manufacturing the ADSC of any of Aspects 8 to 10, further comprising: attaching one or more conductive gaskets between the filter PCB and the enclosure.

Aspect 12. The method of manufacturing the ADSC of any of Aspects 8 to 11, further comprising: attaching one or more resistor-capacitor (RC) circuits on a surface of the filter PCB.

Aspect 13. The method of manufacturing the ADSC of any of Aspects 8 to 12, wherein the ADSC controls one of a mechanical system and an electrical system of an autonomous vehicle.

Aspect 14. The method of manufacturing the ADSC of any of Aspects 8 to 13, further comprising: attaching a non-conductive supporter to connect the filter PCB to the one or more power terminals.

Aspect 15. A printed circuit board (PCB) assembly system comprising: at least one memory comprising instructions; and at least one processor coupled to the at least one memory, wherein the at least one processor is configured to cause the PCB assembly system to: attach one or more power terminals to a primary printed circuit board (PCB); dispose a filter PCB on the primary PCB, wherein the filter PCB includes one or more apertures to permit the one or more power terminals to extend through the filter PCB, wherein the filter PCB mitigates electromagnetic interference emitted from the one or more power terminals; and attach an enclosure to the primary PCB, wherein the one or more power terminals extend through the enclosure.

Aspect 16. The PCB assembly system of Aspect 15, wherein the filter PCB comprises two or more layers.

Aspect 17. The PCB assembly system of Aspect 15 or 16, wherein the at least one processor is further configured to cause the PCB assembly system to: attach one or more electromagnetic interference absorbers on a surface of the filter PCB.

Aspect 18. The PCB assembly system of any of Aspects 15 to 17, wherein the at least one processor is further configured to cause the PCB assembly system to: attach one or more conductive gaskets between the filter PCB and the enclosure.

Aspect 19. The PCB assembly system of any of Aspects 15 to 18, wherein the at least one processor is further configured to cause the PCB assembly system to: attach one or more resistor-capacitor (RC) circuits on a surface of the filter PCB.

Aspect 20. The PCB assembly system of any of Aspects 15 to 19, wherein the primary printed circuit board is part of an autonomous driving super computer (ADSC) configured to control one of a mechanical system and an electrical system of an autonomous vehicle.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

What is claimed is:

1. An autonomous driving super computer (ADSC) comprising:
  an enclosure that is coupled to a primary printed circuit board (PCB) of the ADSC;
  one or more power terminals that are coupled to the primary PCB and extend through the enclosure;
  a filter PCB positioned between the enclosure and the primary PCB, wherein the filter PCB includes one or more apertures to permit the one or more power terminals to extend through the filter PCB, and wherein the filter PCB is configured to mitigate electromagnetic interference emitted from the one or more power terminals.

2. The ADSC of claim 1, wherein the filter PCB comprises four or more layers.

3. The ADSC of claim 1, further comprising:
  one or more electromagnetic interference absorbers disposed on a surface of the filter PCB.

4. The ADSC of claim 1, further comprising:
  one or more conductive gaskets disposed between the filter PCB and the enclosure.

5. The ADSC of claim 1, further comprising:
one or more resistor-capacitor (RC) circuits disposed on a surface of the filter PCB.

6. The ADSC of claim 1, wherein the ADSC controls one of a mechanical system and an electrical system of an autonomous vehicle.

7. The ADSC of claim 1, further comprising:
a non-conductive supporter to connect the filter PCB to the one or more power terminals.

8. A method of manufacturing an autonomous driving super computer (ADSC) comprising:
attaching one or more power terminals to a primary printed circuit board (PCB);
disposing a filter PCB on the primary PCB, wherein the filter PCB includes one or more apertures to permit the one or more power terminals to extend through the filter PCB, wherein the filter PCB mitigates electromagnetic interference emitted from the one or more power terminals; and
attaching an enclosure to the primary PCB, wherein the one or more power terminals extend through the enclosure.

9. The method of manufacturing the ADSC of claim 8, wherein the filter PCB comprises two or more layers.

10. The method of manufacturing the ADSC of claim 8, further comprising:
attaching one or more electromagnetic interference absorbers on a surface of the filter PCB.

11. The method of manufacturing the ADSC of claim 8, further comprising:
attaching one or more conductive gaskets between the filter PCB and the enclosure.

12. The method of manufacturing the ADSC of claim 8, further comprising:
attaching one or more resistor-capacitor (RC) circuits on a surface of the filter PCB.

13. The method of manufacturing the ADSC of claim 8, wherein the ADSC controls one of a mechanical system and an electrical system of an autonomous vehicle.

14. The method of manufacturing the ADSC of claim 8 further comprising:
attaching a non-conductive supporter to connect the filter PCB to the one or more power terminals.

15. A printed circuit board (PCB) assembly system comprising:
at least one memory comprising instructions; and
at least one processor coupled to the at least one memory, wherein the at least one processor is configured to cause the PCB assembly system to:
attach one or more power terminals to a primary printed circuit board (PCB);
dispose a filter PCB on the primary PCB, wherein the filter PCB includes one or more apertures to permit the one or more power terminals to extend through the filter PCB, wherein the filter PCB mitigates electromagnetic interference emitted from the one or more power terminals; and
attach an enclosure to the primary PCB, wherein the one or more power terminals extend through the enclosure.

16. The PCB assembly system of claim 15, wherein the filter PCB comprises two or more layers.

17. The PCB assembly system of claim 15, wherein the at least one processor is further configured to cause the PCB assembly system to:
attach one or more electromagnetic interference absorbers on a surface of the filter PCB.

18. The PCB assembly system of claim 15, wherein the at least one processor is further configured to cause the PCB assembly system to:
attach one or more conductive gaskets between the filter PCB and the enclosure.

19. The PCB assembly system of claim 15, wherein the at least one processor is further configured to cause the PCB assembly system to:
attach one or more resistor-capacitor (RC) circuits on a surface of the filter PCB.

20. The PCB assembly system of claim 15, wherein the primary printed circuit board is part of an autonomous driving super computer (ADSC) configured to control one of a mechanical system and an electrical system of an autonomous vehicle.

* * * * *